(12) United States Patent
Cai

(10) Patent No.: US 10,643,963 B2
(45) Date of Patent: May 5, 2020

(54) SEMICONDUCTOR FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Feng Ping Cai, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/013,546

(22) Filed: Jun. 20, 2018

(65) Prior Publication Data
US 2018/0374806 A1  Dec. 27, 2018

(30) Foreign Application Priority Data
Jun. 22, 2017  (CN) .......................... 2017 1 0481582

(51) Int. Cl.
*H01L 23/00* (2006.01)

(52) U.S. Cl.
CPC .............. *H01L 24/02* (2013.01); *H01L 24/03* (2013.01); *H01L 24/05* (2013.01); *H01L 2224/0239* (2013.01); *H01L 2224/02311* (2013.01); *H01L 2224/02331* (2013.01); *H01L 2224/03009* (2013.01); *H01L 2224/0347* (2013.01); *H01L 2224/03462* (2013.01); *H01L 2224/05008* (2013.01); *H01L 2224/05124* (2013.01); *H01L 2224/05147* (2013.01); *H01L 2224/94* (2013.01); *H01L 2924/01029* (2013.01); *H01L 2924/04941* (2013.01)

(58) Field of Classification Search
CPC ................................................... H01L 23/5386
See application file for complete search history.

(56) References Cited

U.S. PATENT DOCUMENTS

| | | | | |
|---|---|---|---|---|
| 2001/0053574 A1* | 12/2001 | Braun | ............... | H01L 21/28512 438/228 |
| 2002/0105585 A1* | 8/2002 | Kimura | ............. | H01L 27/14609 348/308 |
| 2005/0067640 A1* | 3/2005 | Ohkawa | ........... | H01L 27/14601 257/291 |
| 2011/0074498 A1* | 3/2011 | Thompson | ........ | H01L 21/82341 327/543 |

FOREIGN PATENT DOCUMENTS

| | | |
|---|---|---|
| CN | 1725466 A | 1/2006 |
| CN | 105914181 A | 8/2016 |

* cited by examiner

*Primary Examiner* — Thao P Le
(74) *Attorney, Agent, or Firm* — Anova Law Group, PLLC

(57) ABSTRACT

A semiconductor structure and its fabrication method are provided. The fabrication method includes: providing a base substrate including a wiring region and an isolation region. A patterned layer is formed on the isolation region of the base substrate and the patterned layer exposes the wiring region of the base substrate. After forming the patterned layer, a redistribution layer is formed on the wiring region of the based substrate exposed by the patterned layer. A protective layer is formed on the redistribution layer, and after forming the protective layer, the patterned layer is removed.

17 Claims, 5 Drawing Sheets

SEMICONDUCTOR FABRICATION METHOD THEREOF

CROSS-REFERENCES TO RELATED APPLICATION

This application claims the priority of Chinese Patent Application No. 201710481582.3, filed on Jun. 22, 2017, the content of which is incorporated by reference in its entirety.

TECHNICAL FIELD

The present disclosure generally relates to the field of semiconductor technologies and more particularly, relates to a semiconductor structure and its fabrication method.

BACKGROUND

As integration levels in integrated circuits increase, packaging has become the focus of the microelectronics industry. A redistribution layer (RDL) technology is a part of the advanced packaging technologies, and has important applications in chip packaging with a high I/O density.

In the redistribution layer (RDL) technology, original bonding positions of I/O pads designed in an IC circuit are changed by a wafer-level metallic wiring process and a bumping process, so that different forms of packaging can be applied to the IC circuit. The wafer-level metallic wiring process includes: forming an insulating protective layer on the IC circuit; forming a new wiring pattern by exposure and development processes, and forming new metallic wires by an electric plating method to connect the original aluminum pads and new bumps or gold pads. Correspondingly, the wires in the IC circuit are redistributed. The redistributed metallic wires are mainly made of an electroplated copper. Copper has advantages of a low resistance, a high heat dissipation, and a low cost, and is the best choice for high-current and high-power devices.

The RDL technology can change the original I/O design, increase additional values of the original design, increase spaces between the I/O pads and provide bumps with bigger areas. As such, strains between the substrate and the device are reduced, and reliabilities of the devices are improved.

However, performance of semiconductor structures formed by the redistribution layer technology still needs to be improved. The disclosed devices and methods are directed to at least partially alleviate one or more problems set forth above and to solve other problems in the art.

SUMMARY

One aspect of the present disclosure provides a fabrication method for forming a semiconductor structure. The fabrication method includes: providing a base substrate including a wiring region and an isolation region. A patterned layer is formed on the isolation region of the base substrate and the patterned layer exposes the wiring region of the base substrate. After forming the patterned layer, a redistribution layer is formed on the wiring region of the based substrate exposed by the patterned layer. A protective layer is formed on the redistribution layer, and after forming the protective layer, the patterned layer is removed. In the process for removing the patterned layer, the protective layer may protect the redistribution layer, and may prevent the air and the reactants for removing the patterned layer from eroding the redistribution layer. Correspondingly, a performance of a formed semiconductor structure is improved.

Another aspect of the present disclosure provides a semiconductor structure. The semiconductor structure includes: a base substrate including a wiring region and an isolation region; a redistribution layer on the wiring region of the base substrate; and a protective layer on the redistribution layer. The redistribution layer exposes the isolation region of the base substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
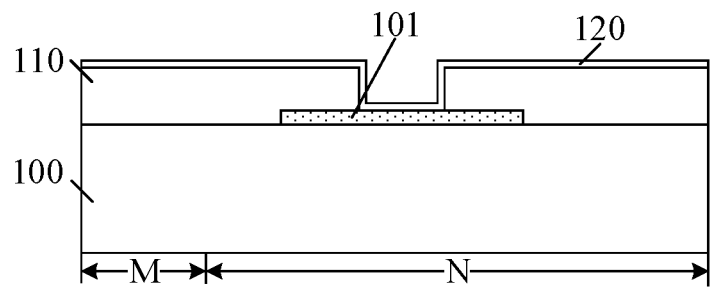
FIGS. 1-3 illustrate semiconductor structures corresponding to certain stages for forming an exemplary semiconductor structure.
Figure 2:
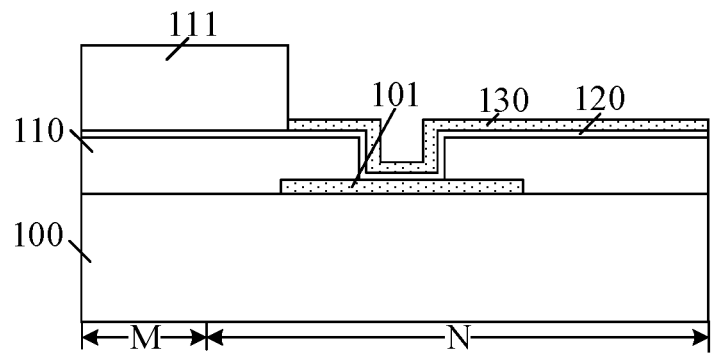
Figure 3:
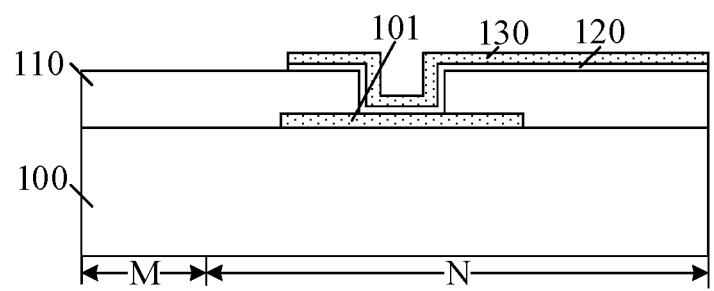

FIGS. 1-3 illustrate semiconductor structures corresponding to certain stages for forming a semiconductor structure.

Referring to FIG. 1, a base substrate 100 may be provided. The base substrate 100 may include a wiring region N and an isolation region M. A bonding pad 101 may be formed on the wiring region N of the base substrate 100. A passivation layer 110 may be formed on the base substrate 100 and on the bonding pad 101. The passivation layer 110 may expose a portion of a top surface of the bonding pad 101.

A seed layer 120 may be formed on the top surface of the bonding pad 101 and on the passivation layer 110.

Referring to FIG. 2, a patterned photoresist 111 may be formed on a first portion of the seed layer 120 in the isolation region M. After forming the photoresist 111, a redistribution layer 130 may be formed on a second portion of the seed layer 120 in the wiring region N.

Referring to FIG. 3, after forming the redistribution layer 130, the photoresist 111 and a portion of the seed layer 120 in the isolation region M may be removed.

The photoresist 111 may be removed by a photoresist-removing solution, and the portion of the seed layer 120 under the photoresist 111 may be removed by an etching solution. An isolation layer may be formed on the redistribution layer subsequently.

The redistribution layer 130 may be made of copper. After forming the redistribution layer 130 by an electroplating process, a self-annealing process may easily occur in the redistribution layer 130 and a portion of the crystalline grains in the redistribution layer 130 may grow bigger. Grain boundaries between the crystalline grains may also become bigger and thicker. The crystalline grains in the redistribution layer 130 may gradually grow from the inside to the surface, and a certain period may be needed for the crystalline grains on the surface of the redistribution layer 130 to grow after forming the redistribution layer 130 by the electroplating process. To prevent the photoresist-removing solution and the etching solution from entering the interior of the redistribution layer 130 through the grain boundaries in the redistribution layer 130 to erode the redistribution layer 130, the photoresist 111 in the isolation region M has to be removed before a self-annealing process occurs to the crystalline grains in the surface of the redistribution layer 130. In this manner, the time interval between the electroplating process and the removing process of the photoresist 111 have to be controlled strictly and the process may become more difficult.

The surface of the redistribution layer 130 may have an active layer where a self-annealing process does not occur. The active layer may prevent the photoresist-removing solution, the etch solution and the oxygen in the air from entering into the redistribution layer 130. The active layer may be easily removed when removing the photoresist 111 and the portion of the seed layer 120 in the isolation region M, to expose grain boundaries in the redistribution layer 130. Correspondingly, small crystalline grains may be easily eroded, inducing a rough surface of the redistribution layer 130. Subsequently, gaps may easily form between the redistribution layer 130 and the isolation layer, and chemicals may enter the gaps in the subsequent processes. Correspondingly, the redistribution layer 130 may be separated from the isolation layer, and the formed semiconductor structure may have a poor performance.

The present disclosure provides a semiconductor structure and its fabrication method. The fabrication method includes forming a protective layer on a redistribution layer before removing a patterned layer. When removing the patterned layer, the protective layer may protect the redistribution layer, and may prevent the air and reactants used to remove the patterned layer from eroding the redistribution layer. The performance of the formed semiconductor structure may be improved.

FIGS. 4-10 illustrate semiconductor structures corresponding to certain stages for forming an exemplary structure according to various disclosed embodiments of the present disclosure.

Figure 4:
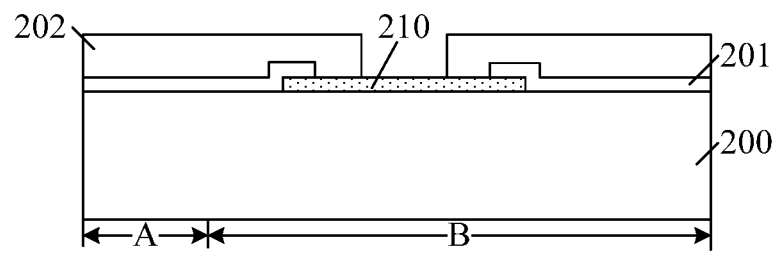
FIGS. 4-11 illustrate semiconductor structures corresponding to certain stages for forming an exemplary structure according to various disclosed embodiments of the present disclosure.
Figure 12:
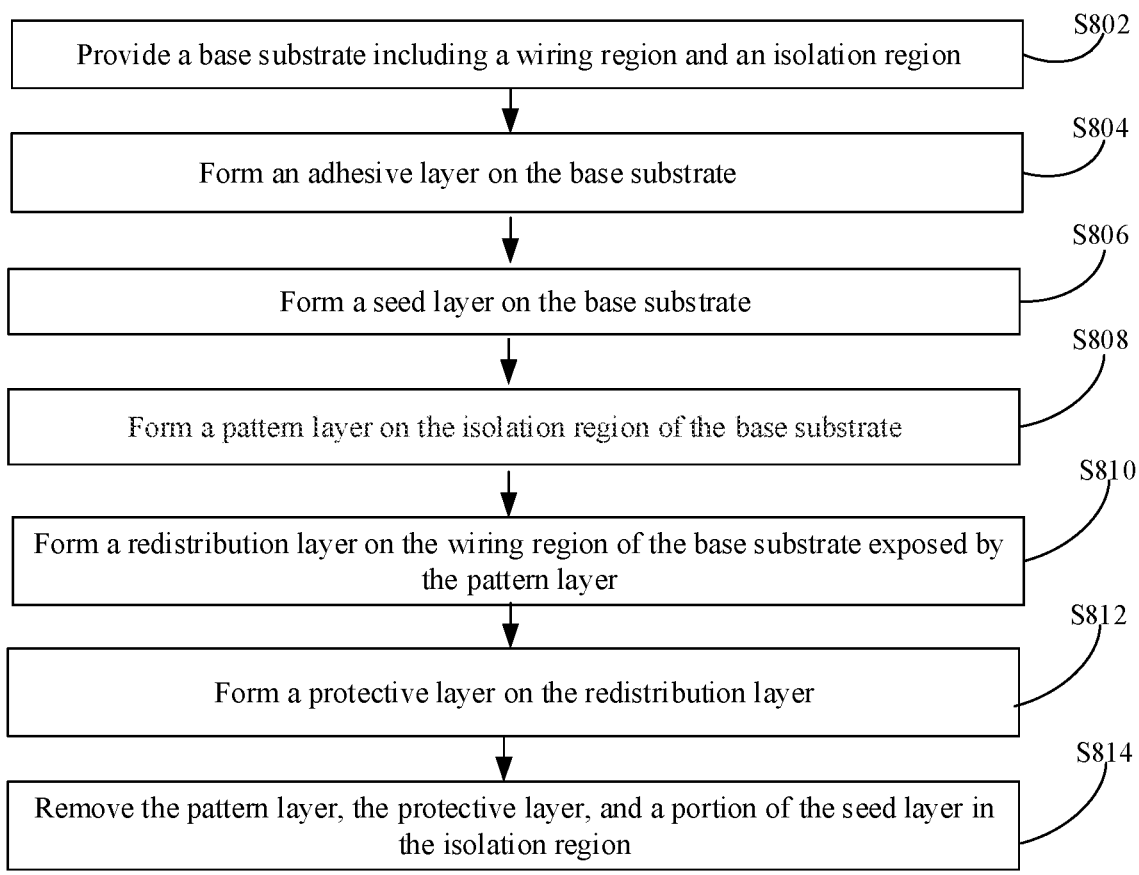
FIG. 12 illustrates an exemplary method for forming a semiconductor structure according to various disclosed embodiments.

Referring to FIG. 4, a base substrate may be provided (e.g., in Step S802 in FIG. 12). The base substrate may include a wiring region B and an isolation region A.

In one embodiment, the base substrate may include: a semiconductor substrate 200 including the wiring region B and the isolation region A; a bonding pad 210 on the wiring region B of the semiconductor substrate 200; a passivation layer 201 on the wiring region B and on the isolation region A of the semiconductor substrate 200. The passivation layer 201 may expose a portion of the bonding pad 210 as shown in FIG. 4.

In one embodiment, a covering layer 202 may be optionally formed on the passivation layer 201 and on the bonding pad 210. The covering layer 202 may expose a portion of the bonding pad 210. In other embodiments, the base substrate may not include the covering layer.

The semiconductor substrate 200 may be a wafer or a chip, and may include semiconductor devices.

The passivation layer 201 and the covering layer 202 may separate the semiconductor substrate 200 from ambient environments, to prevent the semiconductor substrate from being affected by the ambient environments.

In one embodiment, the passivation layer 201 may cover a portion of the bonding pad 210. In one embodiment, the passivation layer 201 may be made of a material including $SiN_x$ and/or SiNO. In one embodiment, the covering layer 202 may be made of a polymer. In one embodiment, the covering layer 202 may cover a portion of the bonding pad 210. The bonding pad 210 may be made of a material including aluminum and/or copper.

Figure 5:
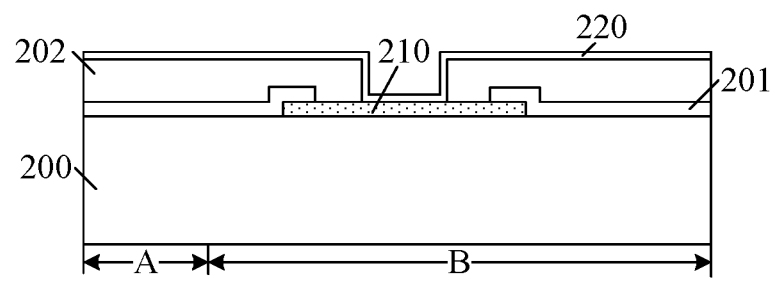

Referring to FIG. 5, an adhesive layer 220 may be formed on the wiring region and on the isolation region of the base substrate (e.g., in Step S804 in FIG. 12). The adhesive layer 220 may increase a bonding force between a subsequent seed layer and the bonding pad 210, and a bonding force between the seed layer and the covering layer 202.

The adhesive layer 220 may be formed on a top surface of the bonding pad 210 and on a top surface of the covering layer 202. The adhesive layer 220 may be made of a material including titanium and/or TiN. The adhesive layer 220 may be formed by a physical vapor deposition process or a chemical vapor deposition process.

In one embodiment, the thickness of the adhesive layer 220 may be about 0.3 μm to about 0.5 μm. When the adhesive layer 220 has a too small thickness, the bonding force between the subsequent seed layer and the bonding pad 210, and the bonding force between the seed layer and the covering layer 202, may not increase efficiency. When the adhesive layer 202 has a too large thickness, the difficulty in the process may increase.

Figure 6:
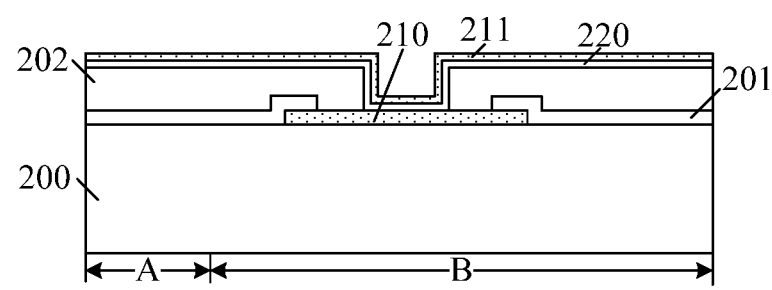

Referring to FIG. 6, a seed layer 211 may be formed on the wiring region and on the isolation region of the base substrate (e.g. in Step S806 in FIG. 12). The seed layer 211 may provide seed crystals for forming a redistribution layer subsequently.

In one embodiment, the seed layer 211 may be formed on the adhesive layer 220. The seed layer 211 may be made of copper. In one embodiment, the seed layer 211 may be formed by the chemical vapor deposition process.

In one embodiment, the seed layer 211 may have a thickness of about 0.5 μm to about 0.6 μm. When the seed layer has a too small thickness, the seed layer 211 may not provide high-quality seed crystals for the subsequent redistribution layer; when the seed layer has a too large thickness, the difficulty in the process may increase.

Figure 7:
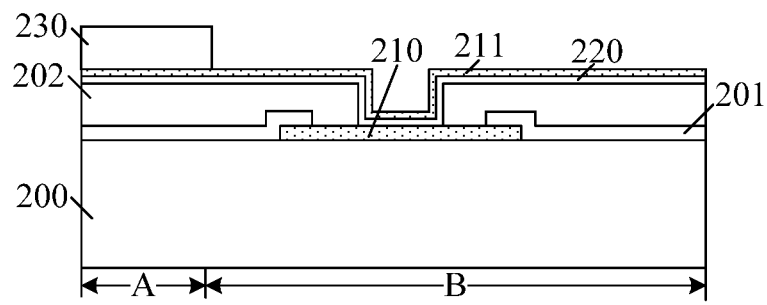

Referring to FIG. 7, a patterned layer 230 may be formed on the isolation region A of the base substrate (e.g. in Step S808 in FIG. 12). The patterned layer 230 may expose the wiring region of the base substrate.

The patterned layer 230 may define positions and dimensions of the subsequent redistribution layer. In one embodiment, the patterned layer 230 may expose the bonding pad 210. The patterned layer 230 may be made of a photoresist. In one embodiment, the photoresist may be formed by a spin coating process.

Figure 8:
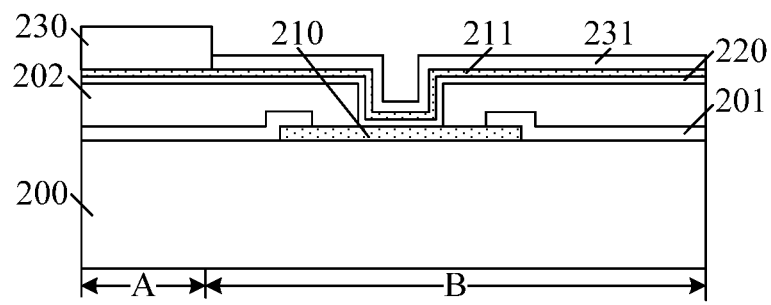

Referring to FIG. 8, after forming the patterned layer 230, the redistribution layer 231 may be formed on the wiring region B of the base substrate exposed by the patterned layer 230 (e.g. in Step S810 in FIG. 12).

The redistribution layer 231 may change original bonding positions of the I/O pads in the IC circuits, so that different forms of packaging can be applied to the IC circuits.

In one embodiment, the redistribution layer 231 may be made of copper. Copper has features including a low resistivity and a good resistance to migration. In other embodiments, the redistribution layer 231 may be made of aluminum.

After forming the redistribution layer 231, a self-annealing process may easily occur in the redistribution layer 231.

A portion of the crystalline grains in the redistribution layer 231 may grow bigger, and grain boundaries between the crystalline grains may become bigger and thicker. The self-annealing process may happen from the inside toward the surface of the redistribution layer 231, and a partial thickness on the surface of the redistribution layer 231 where the self-annealing process does not occur may form an active layer. The active layer may have small crystalline grains and small grain boundaries. The active layer may block the ambient air, the subsequent photoresist-removing solution and the etching solution from entering into the redistribution layer 231 to erode the redistribution layer 231.

In one embodiment, the redistribution layer 231 may be formed by an electroplating process.

In one embodiment, the redistribution layer 231 may have a thickness of about 5 µm to about 10 µm. When the redistribution layer 231 has a too small thickness, a resistance of the redistribution layer 231 and a power consumption of the formed semiconductor structure may increase; when the redistribution layer 231 has a too large thickness, a cost of the process may increase.

Figure 9:
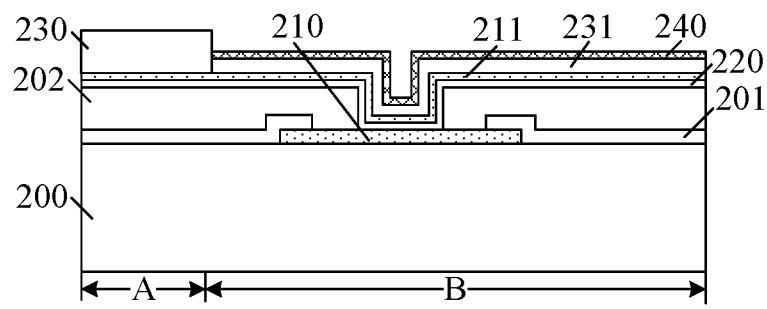

Referring to FIG. 9, a protective layer 240 may be formed on the redistribution layer 231 (e.g. in Step S812 in FIG. 12).

The protective layer 240 may protect the redistribution layer 231 and block the ambient air from eroding the surface of the redistribution layer 231.

The protective layer 240 may further protect the redistribution layer in the subsequent process for removing the patterned layer 230, and prevent the photoresist-removing solution from removing the active layer of the redistribution layer 231. Correspondingly, a flatness of the surface of the redistribution layer 231 may be improved, and a gap between the redistribution layer 231 and a subsequent organic protective layer may be reduced. The protective layer 240 may block the photoresist-removing solution from entering the inside of the redistribution layer 231, and reduce defects in the surface and in the interior of the redistribution layer 231. As such, the performance of the formed semiconductor structure may be improved.

The protective layer 240 may be made of a material including nickel, titanium, and/or zinc. In one embodiment, the protective layer 240 may be removed by a same process for subsequently removing the seed layer 211 in the isolation region A. The process may be simplified.

In one embodiment, the protective layer 240 may be formed by the electroplating process. The electroplating process may use an electroplating solution including organic carbon, boric acid, nickel sulfamate, and nickel chloride. In the electroplating solution, the organic carbon may have a content of about 100 ppm to about 500 ppm, the boric acid may have a concentration of about 35 ppm to about 45 ppm, the nickel sulfamate may have a concentration of about 80 g/L to about 100 g/L, and the nickel chloride may have a concentration of about 10 g/L to about 12 g/L.

In the electroplating solutions, the organic carbon and the boric acid may have a low content, and the formed protective layer 240 may be loose. The protective layer 240 may be removed easily in the process for removing a portion of the seed layer 211 in the isolation region A. In other embodiments, the protective layer 240 may be formed by the physical vapor deposition process.

Figure 10:
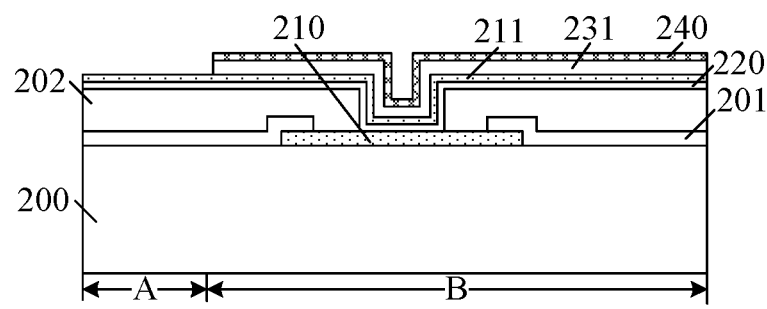

Referring to FIG. 10, after forming the protective layer 240, the patterned layer 230 may be removed (e.g. in Step S814 in FIG. 12).

The patterned layer 230 may be made of a photoresist. In one embodiment, the patterned layer 230 may be removed by a photoresist-removing solution including tetramethylammonium hydroxide. The photoresist-removing solution may react completely with the patterned layer 230 to remove the entire patterned layer 230.

When removing the patterned layer 230, the protective layer may protect the redistribution layer 231, and block the photoresist-removing solution from eroding the redistribution layer 231.

A self-annealing process may not easily occur in the protective layer 240. The protective layer 240 may have small crystalline grains and small grain boundaries. The photoresist-removing solution may not easily pass through the protective layer 240 to enter the redistribution layer 231. Correspondingly, in the fabrication method for forming the semiconductor structure provided by various embodiments in the present disclosure, the time interval between forming the redistribution layer 231 and removing the patterned layer 230 may be increased, and the difficulty in the process may be reduced.

Figure 11:
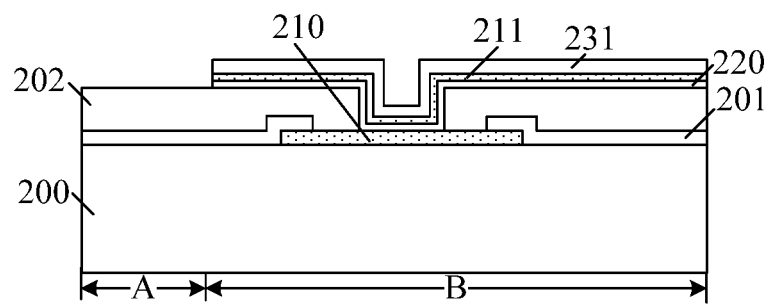

Referring to FIG. 11, after removing the patterned layer 230, the protective layer 240 and a portion of the seed layer 211 in the isolation region A may be removed (e.g. in Step S814 in FIG. 12).

In one embodiment, the protective layer 240 and a portion of the seed layer 211 in the isolation region A may be removed in a same process. The process may be simplified, and damages on the redistribution 231 may be alleviated.

In one embodiment, the protective layer 240 and a portion of the seed layer 211 in the isolation region A may be removed by a wet etching process. The wet etching process may use an etch solution including potassium persulfate. Potassium persulfate may react with materials of the seed layer 211 and the protective layer 240.

Also referring to FIG. 11, after removing a portion of the seed layer 211 in the isolation region A, a portion of the adhesive layer 220 in the isolation region A may be removed.

The adhesive layer 220 and the redistribution layer 231 may be made of different materials, and an etching selective ratio between the adhesive layer 220 and the redistribution layer 231 may be large. The process for removing the adhesive layer 220 may have small damages on the redistribution layer 231. Further, the active layer on the surface of the redistribution layer 231 may block reactants for removing a portion of the adhesive layer 220 in the isolation region A from entering into the redistribution layer 231.

In one embodiment, after removing the adhesive layer 220 in the isolation region A, an organic protective layer (not illustrated) may be formed on the base substrate and on the redistribution layer 231. The organic protective layer may isolate the redistribution layer from the ambient environment.

This present disclosure also provides a semiconductor structure, for example, as shown in FIG. 10. The semiconductor structure may include: a base substrate including a wiring region B and an isolation region A; a redistribution layer 231 on the wiring region B of the base substrate; and a protective layer 240 on the redistribution layer 231.

The base substrate may include: a semiconductor substrate 200 including the wiring region B and the isolation region A; a bonding pad 210 on the wiring region B of the semiconductor substrate 200; a passivation layer 201 on the wiring region B and on the isolation region A of the semiconductor substrate 200. The passivation layer 201 may expose a portion of the bonding pad 210.

In one embodiment, the base substrate may further include a covering layer 202 on the passivation layer 201 and on the bonding pad 210. The covering layer 202 may expose a portion of the bonding pad 210. In other embodiments, the base substrate may not include the covering layer.

In one embodiment, the redistribution layer 231 may be made of copper. The protective layer 240 may be made of a material including nickel, zinc and/or titanium. The redistribution layer 231 may have a thickness of about 0.45 μm to about 0.55 μm.

In the methods provided by various embodiments of the present disclosure, the protective layer may be formed on the redistribution layer before removing the patterned layer. In the process for removing the patterned layer, the protective layer may protect the redistribution layer, and may prevent the air and the reactants for removing the patterned layer from eroding the redistribution layer. Correspondingly, the formed semiconductor structure may have a good performance.

Further, the protective layer and a portion of the seed layer in the isolation region may be removed in a same process. The process may be simplified and damages on the redistribution layer may be reduced.

In the semiconductor structures provided by various embodiments of the present disclosure, the protective layer may protect the redistribution layer, and may prevent the air from eroding the redistribution layer. Correspondingly, defects in the redistribution layer may be reduced, and the formed semiconductor structure may have a good performance.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for forming a semiconductor structure, comprising:
   providing a base substrate including a wiring region and an isolation region;
   forming a patterned layer on the isolation region of the base substrate, wherein the patterned layer exposes the wiring region of the base substrate;
   after forming the patterned layer, forming a redistribution layer on the wiring region of the based substrate exposed by the patterned layer;
   forming a protective layer on the redistribution layer; and
   after forming the protective layer, removing the patterned layer.

2. The fabrication method according to claim 1, wherein:
   the protective layer is made of nickel, zinc, titanium, or a combination thereof.

3. The fabrication method according to claim 1, wherein the protective layer is formed by an electroplating process.

4. The fabrication method according to claim 3, wherein:
   the protective layer is made of nickel; and
   the electroplating process uses an electroplating solution including organic carbon, boric acid, nickel sulfamate, and nickel chloride.

5. The fabrication method according to claim 4, wherein, in the electroplating solution:
   the organic carbon has a content of about 100 ppm to about 500 ppm;
   the boric acid has a concentration of about 35 ppm to about 45 ppm;
   the nickel sulfamate has a concentration of about 80 g/L to about 100 g/L; and
   the nickel chloride has a concentration of about 10 g/L to about 12 g/L.

6. The fabrication method according to claim 1, wherein; the protective layer has a thickness of about 0.45 μm to about 0.55 μm.

7. The fabrication method according to claim 1, wherein:
   the base substrate includes:
   a semiconductor substrate including the wiring region and the isolation region;
   a bonding pad on the wiring region of the semiconductor substrate; and
   a passivation layer on the wiring region and on the isolation region of the semiconductor substrate; wherein
   the passivation layer exposes the bonding pad.

8. The fabrication method according to claim 1, wherein the patterned layer is made of a photoresist.

9. The fabrication method according to claim 8, wherein:
   the patterned layer is removed by a photoresist-removing solution; and
   the photoresist-removing solution includes tetramethylammonium hydroxide.

10. The fabrication method according to claim 1, further including:
    before forming the patterned layer, forming a seed layer on the wiring region and on the isolation region of the base substrate; and
    after removing the patterned layer, removing the protective layer and a portion of the isolation layer on the isolation region.

11. The fabrication method according to claim 10, wherein:
    the seed layer is made of copper; and
    the seed layer has a thickness of about 0.5 μm to about 1 μm.

12. The fabrication method according to claim 10, wherein:
    the protective layer on the wiring region of the based substrate and the portion of the seed layer on the isolation region are removed by a same process.

13. The fabrication method according to claim 10, wherein:
    the protective layer on the wiring region of the based substrate and the portion of the seed layer on the isolation region are removed by a wet etching process; and
    the wet etching process uses an etching solution including potassium persulfate.

14. The fabrication method according to claim 10, further including:
    before forming the seed layer, an adhesive layer is formed on the wiring region and on the isolation region of the base substrate; and
    after removing the portion of the seed layer on the isolation region, a portion of the adhesive layer on the isolation region is removed.

15. The fabrication method according to claim 14, wherein:
    the adhesive layer is made of titanium, TiN, or a combination thereof.

16. The fabrication method according to claim 1, wherein the redistribution layer is made of copper.

17. The fabrication method according to claim 1, wherein the redistribution layer is formed by an electroplating process.

* * * * *